United States Patent
Burnham et al.

(10) Patent No.: US 6,838,396 B2
(45) Date of Patent: Jan. 4, 2005

(54) BILAYER ULTRA-THIN GATE DIELECTRIC AND PROCESS FOR SEMICONDUCTOR METAL CONTAMINATION REDUCTION

(75) Inventors: Jay S. Burnham, East Fairfield, VT (US); James R. Elliott, Richmond, VT (US); Kenneth R. Gault, Charlotte, VT (US); Mousa H. Ishaq, Essex Junction, VT (US); Steven M. Shank, Jericho, VT (US); Mary A. St. Lawrence, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 10/249,292

(22) Filed: Mar. 28, 2003

(65) Prior Publication Data

US 2004/0192065 A1 Sep. 30, 2004

(51) Int. Cl.⁷ .......................... H01L 21/31; H01L 21/469
(52) U.S. Cl. ....................................................... 438/783
(58) Field of Search ................................. 438/783, 778, 438/784, 758, 759, 770, 775, 905

(56) References Cited

U.S. PATENT DOCUMENTS

| | | | |
|---|---|---|---|
| 5,397,720 A | 3/1995 | Kwong et al. | 437/40 |
| 5,464,783 A | 11/1995 | Kim et al. | 437/42 |
| 5,849,643 A | 12/1998 | Gilmer et al. | 438/773 |
| 6,165,279 A | 12/2000 | Tsao et al. | 134/3 |
| 6,197,647 B1 | 3/2001 | Gardner et al. | 438/301 |
| 6,303,522 B1 | 10/2001 | Mertens et al. | 438/774 |

*Primary Examiner*—Craig A. Thompson
(74) *Attorney, Agent, or Firm*—Scully, Scott, Murphy & Presser; William D. Sabo, Esq.

(57) ABSTRACT

A bilayer dielectric structure for substantially reducing or eliminating metal contaminants formed during subsequent polysilicon deposition is provided. The bilayer dielectric structure includes an upper surface region that is rich in chlorine located atop a bottom surface region. The upper surface region that is rich in chlorine removes metal contaminates that are present atop the structure during subsequent formation of a polysilicon layer. A method of forming the bilayer structure is also provided.

12 Claims, 4 Drawing Sheets

BILAYER ULTRA-THIN GATE DIELECTRIC AND PROCESS FOR SEMICONDUCTOR METAL CONTAMINATION REDUCTION

BACKGROUND OF INVENTION

1. Field of the Invention

The present invention relates to semiconductor device manufacturing, and more particularly to a method for substantially reducing and eventually eliminating metal contamination that typically occurs during the fabrication of complementary metal oxide semiconductor (CMOS) transistors.

2. Background of the Invention

Metal contamination is a well-known problem in the semiconductor industry, and is particularly prevalent in forming CMOS transistors that include a polysilicon gate. In a typical CMOS transistor process flow, a gate dielectric is grown atop a surface of a semiconductor substrate and then polysilicon, i.e., polySi, is formed atop the gate dielectric. If there are any metals present on the surface during deposition of polysilicon, the polysilicon does not grow in an amorphous way. Moreover, when metals are present during polysilicon growth, the polysilicon does not grow in a flat manner atop the gate dielectric. Instead, protrusions, i.e., crystalline defects, are formed in the top surface, which hinder patterning of the polysilicon layer. Specifically, when etching the polysilicon layer containing these surface crystalline defects the etching cannot go entirely through the defects thereby creating polysilicon islands that lead to shorting of the polysilicon lines.

This shorting of the polysilicon lines to each other is particularly applicable for closed packed geometries. Such shorting is typically referred to in the art as "pcpc" shorts. This problem is clearly illustrated in FIGS. 1A and 1B where the characteristic defect is displayed. This defect is the result of polysilicon micromasking caused by metal-induced polysilicon growth. The insulator spacer foot is visible as well as the metal silicided polysilicon on the defect.

For this particular example, the metal defect "seed" is located on the surface of the gate dielectric. Traditionally, metal contamination has been removed by cleaning the wafer surface prior to formation of the gate dielectric with a heated chlorinated solution such as, for example, a Huang B cleaning solution, followed by rinsing. In addition to this process as well as other prior art cleaning processes, chlorinated high temperature oxidations can assist in removing metallics from semiconductor surfaces. One such chlorinated high temperature oxidation is a transfer gate sacrificial oxidation process that occurs following block level processing. Another such oxidation is the chlorinated gate oxidation process.

These high temperature chlorinated oxidations have been used in combination or individually through to the 0.13 $\mu$m technology for CMOS transistors. In such devices in which high temperature chlorinated oxidations are employed, the chlorinated furnace sacrificial oxidation may be replaced by an unchlorinated oxidation in a rapid thermal processor to improve cycle time and the gate oxidation process may be changed to use a non-chlorinated ambient (truly 100% $N_2O$) to improve uniformity. The use of $N_2O$ is also required for device performance including prevention of boron penetration, reduction of tunneling leakage current, and the reduction of threshold voltage shifts caused by hot electron effects.

In addition, a nitrogen ion implant may be added to the gate dielectric to further decrease leakage current for gate dielectric thicknesses less than 20 Å. The implanted nitrogen is potentially an added source of metallics, namely iron, since the atomic mass for Fe is a multiple of nitrogen.

The combination of a non-chlorinated sacrificial oxidation, a nitrogen ion implant, and a non-chlorinated gate oxidation ambient puts a tremendous burden on the pre-gate cleaning process and subsequently decreases the process window to produce a metal free surface to the gate oxidation process.

In view of the problems associated with metal contamination, there exists a need for developing a new and improved method in which metal contamination during fabrication of the polySi-containing CMOS transistor is substantially reduced and/or eliminated.

SUMMARY OF INVENTION

A first object of the present invention is to provide a method of forming a CMOS transistor in which metal contaminants that cause polysilicon defects during the formation of the polysilicon gate conductor is substantially reduced or even eliminated.

A second object of the present invention is to provide a method of forming a CMOS transistor in which metal contamination is substantially reduced or eliminated without sufficiently impacting the thickness uniformity of the semiconductor wafer.

A third object of the present invention is to provide a method of forming a CMOS transistor in which metal contamination is substantially reduced or eliminated using processing steps that are compatible with existing CMOS processing steps.

A fourth object of the present invention is to provide a method of forming a CMOS transistor in which shorting of polySi lines to each other is substantially reduced or eliminated.

A fifth object of the present invention is to provide a method of forming a CMOS transistor in which the processing steps do not cause a tremendous burden on the pre-gate cleaning processing step.

A sixth object of the present invention is to provide a method of forming a CMOS transistor in which the process window to produce a metal free surface to the gate oxidation process is not substantially decreased.

These and other objects and advantages are achieved in the present application by providing a gate dielectric that has an upper surface region that is rich in chlorine as compared to a bottom surface region. The chlorine rich upper surface region of the gate dielectric of the present invention cleans up any metal that is present atop of the gate dielectric. The metal contamination is removed during the deposition of the polysilicon layer. This inventive gate dielectric is referred to throughout the instant application as a "bilayer dielectric". In the context of the present application, the terms "gate dielectric" and "bilayer dielectric" are interchangeably used.

In broad terms, the method of the present invention comprises the steps of:

forming in-situ a gate dielectric atop a surface of a semiconductor substrate, said gate dielectric comprises an upper surface region that is rich in chlorine located atop a bottom surface region, wherein said upper surface region that is rich in chlorine removes metal contaminates that are present atop the structure during a subsequent polysilicon deposition step; and forming a patterned polysilicon gate conductor atop portions of the gate dielectric.

The present invention also provides a structure for substantially reducing or eliminating metal contaminates. The structure of the present invention comprises a bilayer dielectric having an upper surface region that is rich in chlorine located atop a bottom surface region, wherein said upper surface region that is rich in chlorine removes metal contaminates that are present atop the structure.

BRIEF DESCRIPTION OF DRAWINGS

These and other objects, features and advantages of the present invention will become apparent from the following detailed description and the appended claims in which:

DETAILED DESCRIPTION

The present invention, which provides a method and structure for substantially reducing or eliminating crystal defects during CMOS transistor fabrication, will now be described in greater detail.

Figure 1A:
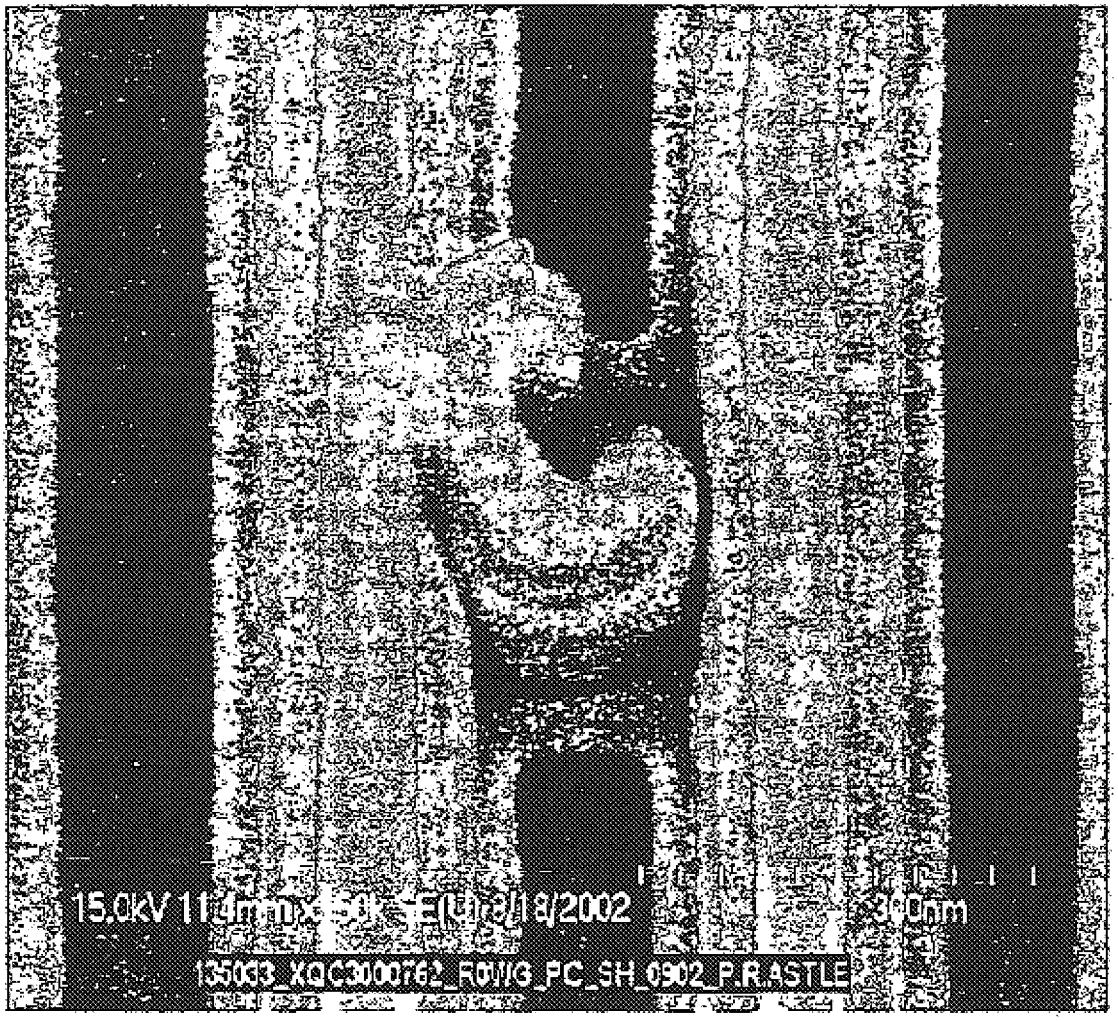
FIGS. 1A–1B are scanning electron micrograms of a prior art polysilicon-containing CMOS device using different scanning conditions.
Figure 1B:
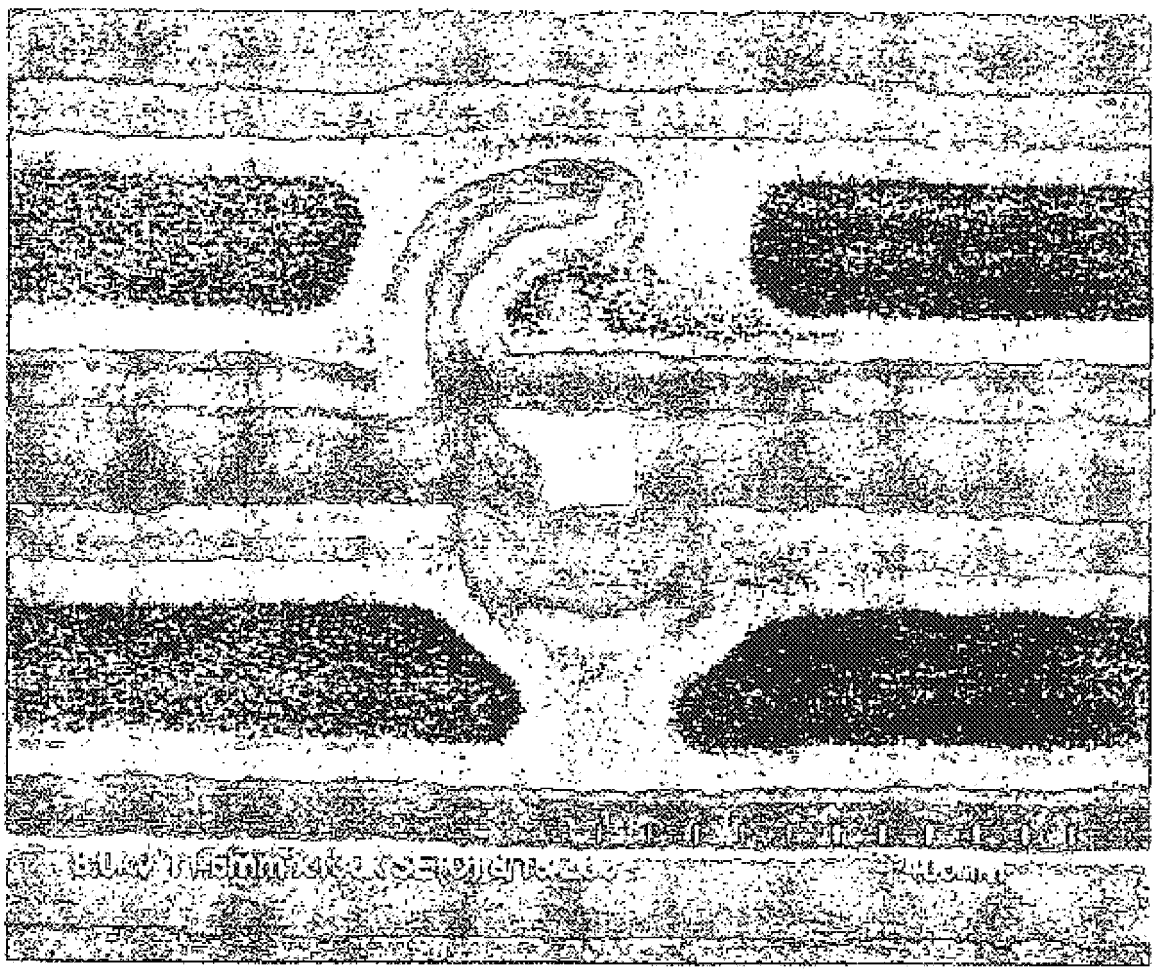
Figure 2:
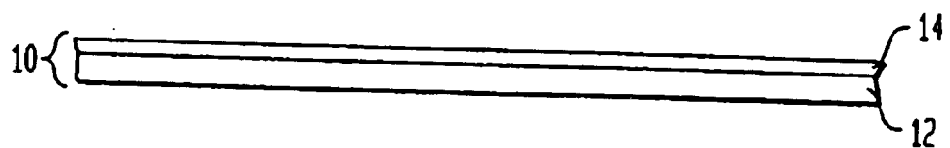
FIG. 2 is a pictorial representation (through a cross sectional view) of the bilayer dielectric structure of the present invention.

In accordance with the present invention and as is illustrated in FIG. 2, an in-situ bilayer dielectric structure 10 is provided which includes an upper surface region 14 that is rich in chlorine. The bilayer dielectric structure is employed in the present invention as a gate dielectric for a polySi-containing CMOS transistor. The upper surface region 14 that is rich in chlorine is located atop a bottom surface region 12 in which the chlorine content present therein is less than that of the upper surface region 14. In accordance with the present invention, the bilayer dielectric structure 10 has a total thickness of from about 1.0 to about 3.0 nm, with a thickness of from about 1.2 to about 2.0 nm being more preferred. The upper surface region 14 that is rich in chlorine has a thickness of from about 0.1 to about 0.5 nm, with a thickness of from about 0.2 to about 0.3 nm being more highly preferred. The upper surface region 14 that is rich in chlorine removes any metal contaminates that may be present atop the structure thereby substantially reducing or eliminating crystalline defects resulting during subsequent polysilicon deposition.

The term "upper surface region that is rich in chlorine" denotes an upper region in the bilayer dielectric structure in which the chlorine concentration is greater than the underlying region. The chlorine concentration in the upper region is typically from about 1 atomic % or greater, with a preferred chlorine concentration in the upper region being from about 1 to about 5 atomic %.

The bilayer dielectric structure 10 including region 12 and region 14 is comprised of a gate insulating material including, but not limited to: oxides including high-k dielectrics (having a dielectric constant of about 7.0 or greater), such as Al$_2$O$_3$ or perovskite-type oxides; nitrides; oxynitrides; or any combination and multilayer thereof. Highly preferred gate insulating materials that are employed in the present invention include: silicon oxynitride or silicon nitride.

Figure 3A:
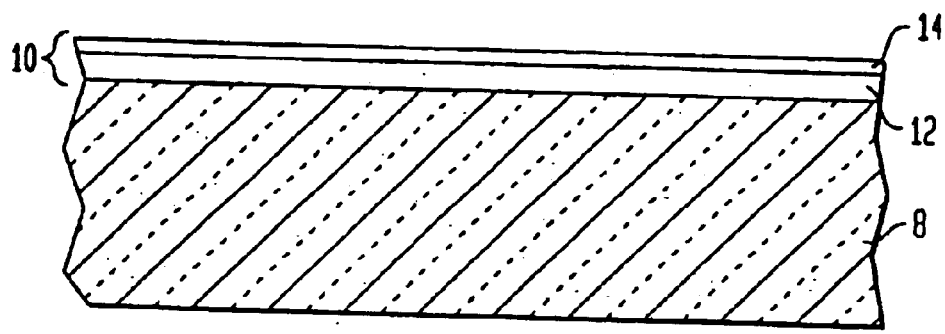
FIGS. 3A–3D are pictorial representations (through cross sectional views) illustrating the basic processing steps of the present invention.
Figure 3B:
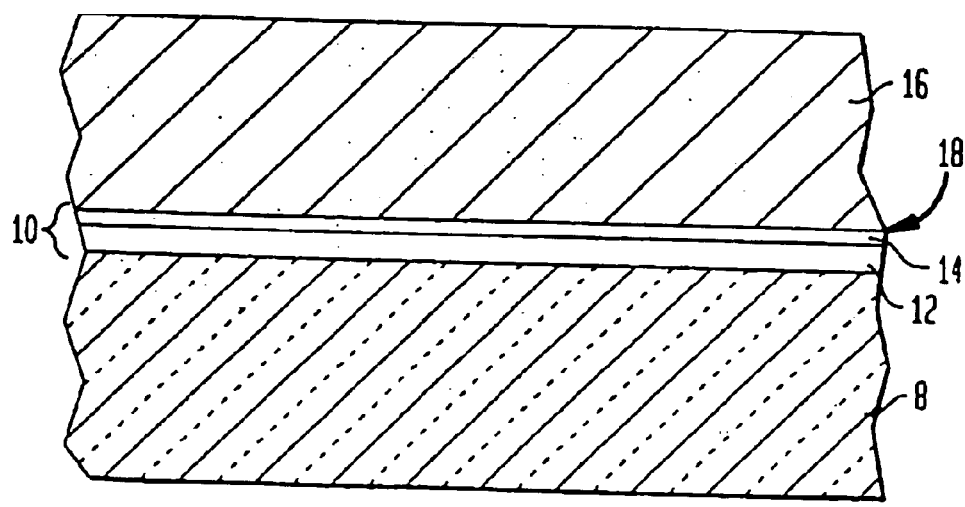

The bilayer dielectric structure 10 shown in FIG. 2 is typically used in CMOS transistors to substantially reduce or eliminate crystalline defects resulting during the subsequent deposition of a polysilicon layer. FIGS. 3A–3D illustrate the basic processing steps that are used in the present invention for forming a CMOS transistor in which the bilayer dielectric structure of FIG. 2 is incorporated therein. Reference is first made to FIG. 3A, which shows an initial structure that is formed after the inventive bilayer dielectric structure 10 is formed atop a semiconductor substrate 8.

The semiconductor substrate 8 comprises any semiconductor material including, but not limited to: Si, Ge, SiGe, GaAs, InAs, InP and all other III/V compound semiconductors. Layered semiconductors comprising the same or different semiconductor material such as Si/Si, Si/SiGe and silicon-on-insulator (SOI) may be also employed in the present invention. In an SOI substrate, a buried insulating material, such as an oxide, electrically insulates a top Si-containing layer from a bottom Si-containing layer. Semiconductor substrate 8 may be undoped or doped with an n- or p-type dopant depending on the type of device to be fabricated.

When a doped semiconductor substrate is employed in the present invention, a sacrificial oxide layer (not specifically shown) is formed by deposition or oxidation across the entire surface of the semiconductor substrate. The sacrificial oxide layer may have any desired thickness. Typically, however, the sacrificial oxide layer has a thickness of from about 4 to about 8 nm. Following formation of the sacrificial oxide layer, dopants are introduced into the semiconductor substrate using ion implantation (masked or maskless process) and thereafter the implanted dopants are activated using an activation anneal process. The conditions for the ion implant and activation anneal are conventional and are thus well known to those skilled in the art. After the activation anneal, the sacrificial oxide layer may be removed using a conventional stripping process that is capable of removing oxide as compared to semiconductor substrate. In some embodiments, the sacrificial oxide layer remains on the surface until after isolation regions are formed in the semiconductor substrate 8.

Semiconductor substrate 8 may-include various isolation regions such as shallow trench isolation (STI) regions or local oxidation of silicon (LOCOS) isolation regions formed in the surface thereof utilizing conventional processes well known to those skilled in the art. For clarity, the drawings of the present invention do not specifically show the presence of the isolation regions, however, reference numeral 8 is meant to include those regions. One highly preferred semiconductor substrate 8 employed in the present invention is an SOI substrate.

Prior to forming the bilayer dielectric structure 10 atop the semiconductor substrate 8, the semiconductor substrate 8 may be subjected to a conventional gate pre-cleaning process wherein any contaminates or native oxides are removed from the surface of semiconductor substrate 8. An illustrative example of a conventional gate pre-cleaning process that may be employed in the present invention includes, but is not limited to: a Huang B solution, e.g., a heated HCl-containing solution. A rinsing step may follow the gate pre-cleaning step.

The bilayer dielectric structure 10 of the present invention, which forms the gate dielectric of a CMOS transistor, is then formed in-situ atop the semiconductor substrate 8. The bilayer dielectric structure 10 of the present invention, which is shown in detail in FIG. 2, can be formed utilizing one of the following embodiments. In FIG. 3A, the size of the bilayer dielectric structure of FIG. 2 has been reduced.

In a first embodiment of the present invention, the bilayer dielectric structure 10 is formed using a furnace in which gases can be introduced for the deposition of a dielectric material that has been pre-purged with chlorine or a chlorine-containing gas. The term "chlorine-containing gas" is used throughout this application to denote any gas that contains chlorine. Illustrative examples of chlorine-containing gases that may be employed in the present invention include, but are not limited to: HCl, $C_2H_2Cl_2$ (1,2 trans-dichloroethylene), $C_2H_3Cl_3$ (1,1,1-trichloroethane) and mixtures thereof.

In the pre-purge embodiment of the present invention, a chlorine or chlorine-containing gas is introduced into a typical furnace that includes quartz walls and tubing at an elevated temperature of about 800° C. or greater for a time period of about 10 minutes or greater. More preferably, the chlorine or chlorine-containing gas is introduced into the furnace at a temperature of about 1000° C. or greater for a time of about 1 hour or greater. The purpose of the pre-purge is to ensure that chlorine gets absorbed into the tubing and quartz walls of the furnace prior to oxidation, nitridation or oxynitridation.

The concentration of chlorine that gets absorbed during the pre-purge embodiment of the present invention is dependent on the size of the furnace as well as the flow rate of the chlorine or chlorine-containing gas used in the pre-purge step. Typically, in the present invention, the chlorine or chlorine-containing gas is introduced into the furnace at a flow rate of about 50 to about 500 sccm, with a flow rate of from about 100 to about 200 sccm being more preferred.

In some embodiments, the chlorine or chlorine-containing gas is admixed with an inert gas such as He, Ne, Ar, Xe or Kr. When an inert gas is admixed with the chlorine or chlorine-containing gas, the flow rate for the chlorine or chlorine-containing gas is from about 50 to about 500 sccm and the flow rate for the inert gas is from about 500 to about 5000 sccm. The admixing may occur either outside the reactor chamber of the furnace or within the reactor chamber of the furnace. It should be emphasized that the flow rates provided herein are exemplary and that other flow rates besides the foregoing may be employed in the present invention.

The oxidation, nitridation or oxynitridation is performed using standard conditions and reactant gas ambients that are well known to those skilled in the art. For oxidation, the gas ambient employed is an oxygen-containing gas such as $O_2$, ozone and steam, while for nitridation or oxynitridation, the gas ambient is a nitrogen-containing gas such as $NH_3$, NO and $N_2O$. Mixtures and combinations of nitrogen-containing, oxygen-containing, and inert gases may also be employed. During the oxidation, nitridation or oxynitridation process which is typically conducted at a temperature of about 600° C. or greater for about 1 minute or greater, the chlorine that was previously absorbed in the tubing and the quartz walls of the furnace desorbs and gets entrained in the gas ambient forming the bilayer dielectric structure 10 of the present invention.

In a second embodiment of the present invention, the bilayer dielectric structure 10 can be formed atop semiconductor substrate 8 using an oxidation, nitridation or oxynitridation process where chlorine or a chlorine-containing gas is introduced either with the reactant gas precursor, i.e., oxygen-containing gas and/or nitrogen containing gas, or immediately after the reactant gas has been introduced into the furnace.

In the application in which the chlorine or chlorine-containing gas is introduced with the reactant gas, the flow rate for the reactant gas is typically from about 1000 to about 20000 sccm, while the flow rate of the chlorine or chlorine-containing gas is from about 5 to about 50 sccm. The thermal deposition process using the gas mixture of reactant gas and chlorine or chlorine-containing gas is performed at a temperature of about 600° C. or greater for a time period of about 5 minutes or greater. More preferably, the thermal deposition process using the gaseous mixture of reactant gas and chlorine or chlorine-containing gas is performed at a temperature of about 700° C. or greater for a time period of about 5 minutes or greater.

When the chlorine or chlorine-containing gas is introduced immediately after the reactant gas, the flow rate of the chlorine or chlorine-containing gas is from about 50 to about 500 sccm, with a flow rate of from about 100 to about 200 sccm being more highly preferred. In this embodiment of the present invention, the chlorine or chlorine-containing gas is introduced at a temperature of about 800° C. or greater for a period of time of about 1 minute or greater. More preferably, when the chlorine or chlorine-containing gas is introduced immediately after the reactant gas, the chlorine or chlorine-containing gas is introduced at a temperature of about 1000° C. or greater for a period of time of about 1 minute or greater.

In a third embodiment of the present invention, the bilayer dielectric structure 10 can be formed using a chemical vapor deposition (CVD) process where chlorine or a chlorine-containing gas is used together with a reactant gas or it is introduced immediately after the deposition of the reactant gas. In the CVD embodiments, the CVD process is performed at a temperature of about 720° C. or greater for a time period of about 5 minutes or greater. The reactant gases, chlorine-containing gases and flow rates described above may be used in this embodiment of the present invention.

In a fourth embodiment of the present invention, the bilayer dielectric structure is formed by first performing a thermal process in which chlorine or a chlorine-containing gas is admixed with an oxygen-containing gas. This gaseous admixture is used in forming a chlorine oxide layer on the surface of the semiconductor substrate 8. The chlorine oxide layer is then subjected to a plasma oxidation, nitridation or oxynitridation process which is capable of forming the bilayer dielectric structure 10 of the present invention. The flow rates, reactant gases and temperatures used in the second embodiment of the present invention can be used in this embodiment as well.

It is emphasized that in each of the four embodiments mentioned above, the inventive bilayer dielectric structure having an upper surface region rich in chlorine is formed. As stated above, the bilayer dielectric structure of the present invention is used to remove crystalline defects that may be formed during the subsequent deposition of a polysilicon layer. The crystalline defects are caused by metal contamination that is present on the surface of the structure during deposition of the polysilicon layer. The upper surface region that is rich in chlorine forms a volatile metal chloride during the pre-heating or temperature stabilization steps, prior to the introduction of silicon containing precursors to form the deposited poly-silicon layer. This volatile metal chloride reaction removes metals prior and during the deposition of the initial monlayers of the poly-silicon layer.

Following formation of the bilayer dielectric structure 10 on the surface of semiconductor structure 8, a polysilicon layer 16 is formed atop the upper surface region 14 that is rich in chlorine. The resultant structure that is formed after this step of the present invention has been performed in shown, for example, in FIG. 3B.

The polysilicon layer 16 may be formed utilizing a deposition process such as, for example, chemical vapor deposition (CVD), plasma-assisted CVD, evaporation, chemical solution deposition and other like deposition processes. The polysilicon may be doped at this point of the present invention utilizing an in-situ doping deposition process. Alternatively, doping of the polysilicon layer 16 may occur after deposition, but prior to patterning, or even after patterning. When the doping is performed after deposition, the dopant is introduced into the polysilicon layer 16 using ion implantation and annealing.

The thickness of the polysilicon layer 16 formed at this point of the present invention may vary depending on the process employed in depositing the same. Typically, however, the polysilicon layer 16 has a thickness of from about 140 to about 210 nm, with a thickness of from about 150 to about 160 nm being more highly preferred.

It is noted that the deposition of the polysilicon layer 16 is performed at an elevated temperature which is typically about 600° C. or greater for a time period of about 15 minutes or greater. Under the foregoing conditions, the chlorine present in the bilayer dielectric is believed to amass via diffusion at the top dielectric surface or the polysilicon/bilayer dielectric structure interface. Moreover, prior to and during the polysilicon deposition, the amassed chlorine is believed to react with metal contaminates forming a metal chloride compound or complex, which is volatile. The volatile metal chloride compound or complex is removed as the deposition of polysilicon continues.

The effect is to provide a structure in which there is reduced metal contamination present in the structure. Additionally, the presence of chlorine in the upper surface region has an added benefit of providing a substantially smooth and continuous interface region between the deposited polysilicon layer 16 and the bilayer dielectric structure 10. The substantially smooth and continuous interface region is labeled as reference numeral 18 in FIG. 3B. The term "smooth and continuous interface" denotes that little or no divots or pits are present between the deposited polysilicon layer 16 and the bilayer dielectric structure 10.

Figure 3C:
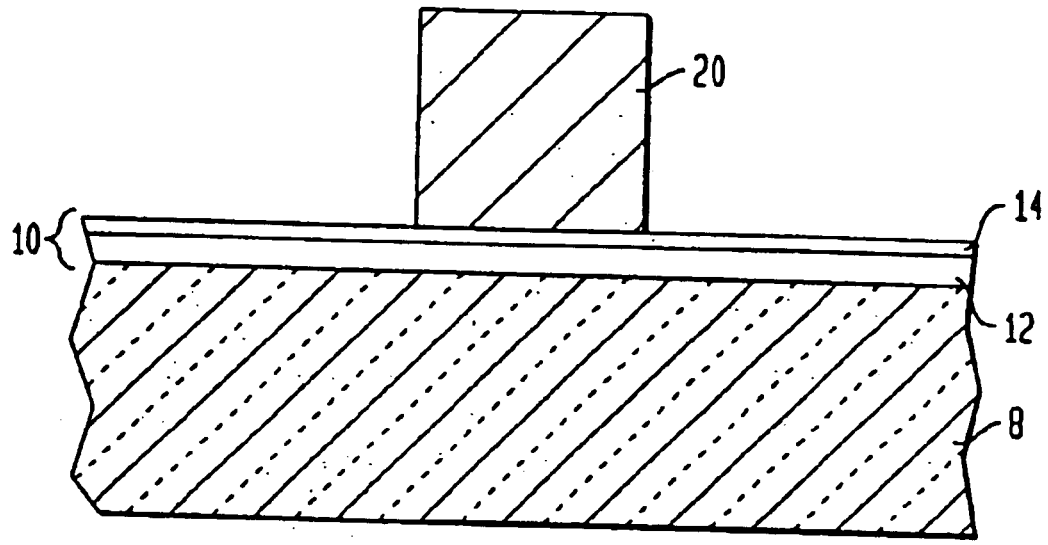

After deposition of the polysilicon layer 16 atop the bilayer dielectric 10, the polysilicon layer 16 may be patterned utilizing lithography and etching providing the structure shown, for example, in FIG. 3C. The lithography step includes applying a photoresist (not shown) to the surface of the polysilicon layer 16, exposing the photoresist to a pattern of radiation and developing the pattern in the photoresist by utilizing a resist developer. The pattern is then transferred at least to the polysilicon layer 16 by an etching step. The etching step comprising a wet chemical etching process, a dry etching process or a combination thereof. Despite the possibility of using various etching processes, it is preferred in the present invention to conduct the pattern transfer utilizing a dry etching process such as reactive-ion etching (RIE), ion beam etching, plasma etching or laser ablation.

In some embodiments, the pattern may also be transferred into the bilayer dielectric structure at this point of the present invention. Although it is possible to etch into the bilayer dielectric structure at this step of the present invention, it is preferred in the present invention to form spacers atop the bilayer dielectric and then etch the portions of the bilayer dielectric that are not underneath the patterned polysilicon layer or the spacers. After the desired pattern transfer, the patterned photoresist is removed from the structure utilizing a conventional photoresist stripping process. In FIG. 3C, reference numeral 20 denotes the patterned polysilicon layer, which is hereinafter referred to as polysilicon gate conductor 20.

Figure 3D:
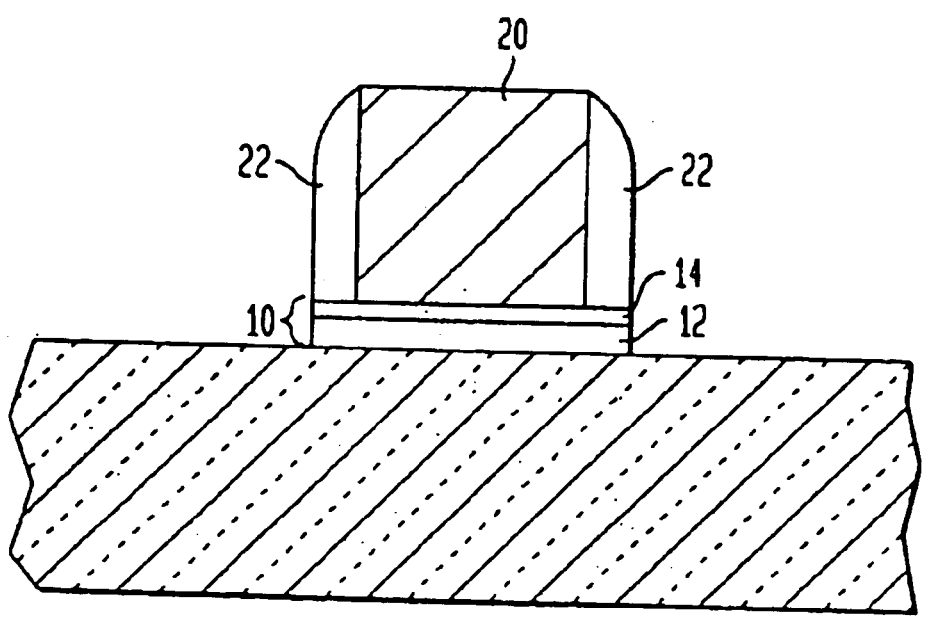

After removing the patterned photoresist from the structure, a least one pair of spacers 22 can be formed on each exposed sidewall of polysilicon gate conductor 20. The spacers 22 are comprised of an insulating material including, for example, an oxide, nitride, oxynitride or any combination or multilayer thereof. The spacers 22 are formed by deposition and etching. The spacers 22 can be formed atop a portion of the bilayer dielectric structure, if not previously etched, or atop the semiconductor substrate itself. FIG. 3D illustrates a structure including spacers 22 that are formed atop portions of the bilayer dielectric structure. Note that during the spacer etch portions of the bilayer dielectric that are not underneath the polysilicon gate conductor 20 or spacers 22 are removed.

Further CMOS processing steps including, but not limited to, source/drain extension formation (which may occur prior to, or after spacer formation), source/drain formation, raised source/drain formation and silicide contacts above the source/drain regions as well as atop the polysilicon gate conductor 20 may be employed. For clarity, these other regions are not shown in any of the drawings of the present invention. While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for reducing or eliminating crystalline defects present during polysilicon deposition, said method comprising the step of:

forming in-situ a gate dielectric atop a surface of a semiconductor substrate, said gate dielectric comprises an upper surface region that is rich in chlorine located atop a bottom surface region, wherein said upper surface region that is rich in chlorine removes metal contaminates that are present during a subsequent polysilicon deposition.

2. The method of claim 1 wherein said forming step comprises pre-purging a furnace with chlorine or a chlorine-containing gas and then depositing said gate dielectric.

3. The method of claim 2 wherein said pre-purging is performed at a temperature of about 800° C. or greater for a time period of about 10 minutes or greater.

4. The method of claim 2 wherein said pre-purging is performed to absorb chlorine into walls and tubing of the furnace.

5. The method of claim 2 wherein said depositing comprises an oxidation, nitridation, oxynitridation or any combination thereof.

6. The method of claim 1 wherein said forming comprises an oxidation, nitridation, oxynitridation or any combination thereof where chlorine or a chlorine-containing gas is introduced with a reactant gas.

7. The method of claim 1 wherein said forming comprises an oxidation, nitridation, oxynitridation or any combination thereof where chlorine or a chlorine-containing gas is introduced immediately after a reactant gas has been introduced.

8. The method of claim 1 wherein said forming comprises a chemical vapor deposition process where chlorine or a chlorine-containing gas is introduced with a reactant gas.

9. The method of claim 1 wherein said forming comprises a chemical vapor deposition process where chlorine or a chlorine-containing gas is introduced immediately after a reactant gas has been introduced.

10. The method of claim 1 wherein said forming comprises depositing a chlorine oxide layer and then subjecting the chlorine oxide layer to plasma oxidation, plasma nitridation or plasma oxynitridation.

11. A method of forming a CMOS transistor comprising the steps of:

forming in-situ a gate dielectric atop a surface of a semiconductor substrate, said gate dielectric comprises an upper surface region that is rich in chlorine located atop a bottom surface region, wherein said upper surface region that is rich in chlorine removes metal contaminates that are present atop the structure during a subsequent polysilicon deposition step; and forming a patterned polysilicon gate conductor atop portions of the gate dielectric.

12. The method of claim 11 wherein said forming of said gate dielectric comprises pre-purging a furnace with chlorine or a chlorine-containing gas and then depositing said gate dielectric.

* * * * *